United States Patent Office 3,694,250
Patented Sept. 26, 1972

3,694,250
ELECTROLESS COPPER PLATING

John J. Grunwald, New Haven, Harold L. Rhodenizer, Bethlehem, and Leo J. Slominski, Bristol, Conn., assignors to MacDermid Incorporated, Waterbury, Conn.
No Drawing. Filed Sept. 17, 1969, Ser. No. 858,837
Int. Cl. B44d *1/34;* C23c *3/02*
U.S. Cl. 117—50 4 Claims

ABSTRACT OF THE DISCLOSURE

Copper surfaces are plated in a process comprising etching, activating, electroless and/or electrolytic copper deposition, and heating or baking at a temperature of about 150° to about 450° F. for about 10 min. to about 2 hours or more. Substantial improvement in the adhesion between the copper surface and the metal deposited by electroless and/or electrolytic plating is achieved. Processes for plating on copper-clad plastic substrates and for the manufacture of printed circuit boards are also set forth.

This invention relates to a process for copper plating and, more particularly, to a process for plating copper on a copper substrate which comprises etching, activating, electroless and/or electrolytic plating and heating or baking. The plated products formed exhibit improved copper to copper adhesion over products prepared by the prior art methods. In another aspect, this invention relates to a process for plating on copper-clad plastic substrates, as, for example, in the manufacture of printed circuit boards.

A number of electroless metal deposition processes exist for the plating of a metal coating on conductive, nonconductive or semi-conductive substrates. Typical prior art methods consist in cleaning of the substrate surface, treating the surface by immersion in a bath containing stannous chloride or another stannous salt, catalyzing the surface to provide catalytic nucleating centers on the surface of the substrate by immersion in a salt of a metal catalytic to the deposition of the desired metal coating such as palladium chloride, the metal ions being reduced to catalytic metal nuclei by the stannous ions previously adsorbed on the substrate surface or by contact with a reducing agent incorporated in the electroless metal deposition bath and finally plating on the surface the desired metal, such as copper, nickel or cobalt, by treating the catalyzed surface with an electroless solution comprising a salt of the metal and a reducing agent. Other processes in the art, such as the one-stage activation of surfaces for the reception of an electroless metal coating, exist. In such a process the surface after proper cleaning is activated by treatment with, for example, (a) an acidic aqueous solution containing 0.01 to 5.0 grams per liter of palladium ions as palladium chloride and an excess of the stoichiometric amount of stannous ions based on the amount of palladium ions present as set forth in British Pat. 942,850 or (b) a tin-palladium hydrosol such as that disclosed in copending D'Ottavio application Ser. No. 654,307, filed June 28, 1967, now Pat. No. 3,532,518.

In plating copper electrolessly on a copper substrate all of the processes proposed by the prior art have suffered from several disadvantages, the most serious being that the adhesion between the plated copper and the copper surface has been inconsistent and often very poor. For example, the electroplated copper could easily be stripped off merely by the application of a pressure sensitive adhesive coated cellophane tape. This problem has been especially troublesome in the preparation of printed circuit boards.

In manufacturing printed boards, one preferred method utilizes an electroless metal deposit on a dielectric substrate either as a uniform surface coating or in a predetermined pattern. The initial electroless deposit of copper is usually thin and is further built up by electroplating to the desired thickness. In preparing printed circuit boards, the plastic substrate is commonly a copper-clad plastic laminate which may have a copper foil laminated to one or both of its surfaces. Generally, both surfaces of the plastic substrate are utilized with the printed circuit board and connections are provided between the two surfaces by means of holes through the laminate at appropriate locations, the walls of such through holes are made conductive with an electroless coating. A major disadvantage in preparing printed circuit boards by the electroless plating methods previously described was that the previous methods of activation were not satisfactory for simultaneously sensitizing the plastic surface as well as the copper surface so that an adherent copper coating resulted in the electroless plating step. Since the adhesion of the copper film to the copper foil of printed circuits boards previously prepared by the so-called two-stage process of activation was so poor, in order to achieve an adherent coating on the copper foil surface during the electrolytic plating step the surface of the copper foil was mechanically abraded before electroplating to remove all traces of the electroless deposit. Not only did this add additional operations which were costly and time consuming but frequently the laminates were ruined by such processing steps. Another major problem encountered because of the poor adhesion of the electroless coating to the copper cladding was that the poor bond caused difficulties at the boundary line between the electroless coating in the through hole walls and the copper foil at hole edges. Frequently, it was necessary to remove the electroless coating to the edge of the metal foil and unless this was done a poor connection often resulted. Removal of the electroless coating from the foil edge by machining and other appropriate methods not only increased the expense but frequently resulted in a high ratio of rejected laminates.

Some improvement in copper-to-copper adhesion was achieved with the introduction of the so-called one stage activation systems which employ, for example, a colloidal suspension of palladium or an activating agent of the type set forth in British Patent 942,850 which comprises an acidic aqueous solution of palladium ions as palladium chloride and an excess of a stochiometric amount of stannous ions based on the amount of palladium ions present. The improvement in the copper-to-copper bond in such an electroless metal plating operation was achieved only when all the steps preceding metallization are stringently controlled. Despite the limited improvement made with certain refined processes in the art for electrolessly plating copper on a copper substrate or surface such as the one-stage activation process just described, prior to the process of the applicants', the art was not aware of any electroless process which gave adequate copper-to-copper adhesion consistently and reliably. For this reason in manufactcring circuit boards commercially the step of sanding or buffing the copper-clad surface of the plastic laminate after the electroless plating step in order to remove completely the thin film thus laid down is still retained by some manufacturers.

It is a primary object of this invention to provide an electroless plating process for plating copper on a copper surface which will give an adequate bond between the deposited copper and the initial copper-clad surface. A second object of the invention is to provide a process for the manufacture of printed circuit boards in which the electroless copper plated on the copper-clad surface will have a bond so strong that it will not need to be removed prior to the electrolytic plating step.

ELECTROLESS PLATING PROCESS

In the first step in the electroless copper plating process of this invention the copper surface must be cleaned to remove any surface grime. Any of the commonly used metal cleaning processes known in the art can be employed to clean the surface of the copper sheet. Oils and greases on the copper sheet may be readily removed by immersion in an organic solvent vapor and trichloroethylene vapor degreasing is a common method employed. After the degreasing operations, if required, the copper surface can be scrubbed with a slurry of an abrasive, such as pumice or aluminum oxide powder and water although this step is not absolutely necessary. The usual light soils are removed from the copper surface by mild alkaline soak cleaners which are often designed to clean the copper by inclusion of complexing agents. Usually the copper surface is immersed in the cleaning solution maintained in a heated condition and with agitation of the work piece. A typical alkaline cleaner composition useful in cleaning copper surfaces is as follows:

| | G./l. |
|---|---|
| Sodium isopropyl naphthalene sulfonate | 3 |
| Sodium sulfate | 1 |
| Sodium tripolyphosphate | 14 |
| Sodium metasilicate | 5 |
| Tetrasodium pyrophosphate | 27 |

Preferably, the cleaning operation is performed at a temperature of about 160–180° F. and the copper sheet is permitted to remain in the bath for a period of about three to about 30 minutes. Other suitable alkaline cleaning compositions such as conventional soaps and detergents may also be used although care should be employed in selecting the particular cleaning agent to be sure that the specimen to be treated is not attacked by the cleaner.

ETCHING

Next, the copper surface is immersed, dipped or otherwise contacted with a copper etching solution to remove superficial oxides from the copper surface. Any of the commonly employed copper etchants may be utilized in the process of this invention. Typically suitable etchants include aqueous solutions of ammoniacal chlorite, ammonium persulfate, cupric chloride, etc. The etching treatment for removal of the copper oxide should be conducted at a temperature of about 85° to about 180° F. for about 1 to about 10 minutes. The treatment time and temperature must be carefully selected particularly where the copper surface may be attacked excessively resulting in the removal not only of the oxide material but also a substantial amount of the copper substrate itself. Cupric chloride may leave a residue on the surface of the copper which can be readily removed by immersion in a dilute hydrochloric acid solution.

CATALYZATION

The copper surface, after being rinsed and immersed in a mild acid bath is subjected to the catalyzation or activation step using any of the two-step or one-step activation procedures known in the art. In the two-step procedure the copper surface is first immersed in a solution of stannous chloride in hydrochloric acid at a temperature of from about 70° to about 150° F. for 1 to 10 minutes following which it is dipped into a hydrochloric acid solution of palladium chloride at a temperature of from about 85° to about 175° F. for 1 to 20 minutes or more, a well-known procedure as described in the art and as set forth in British Pats. 918,220 and 942,850. Activation or catalysis may also be effected by any of the one-step procedures such as by employing an acid tin-palladium hydrosol. Such hydrosols can be prepared as disclosed in copending application of D'Ottavio Ser. No. 654,307 filed June 28, 1967 by:

(a) first dissolving, for example, 2 g. of palladium chloride in hydrochloric acid;
(b) adding to the solution of step (a) 4 g. of anhydrous stannous chloride, and agitating the resulting solution to dissolve the stannous salt therein completely;
(c) separately dissolving in hydrochloric acid a mixture of 96 g. of anhydrous stannous chloride and 14 g. of sodium stannate and
(d) admixing the solution prepared in step (c) with that prepared in step (b) while effecting thorough agitation.

In preparing the hydrosol, the amount of palladium chloride added must be sufficient to provide the equivalent of from about 0.05 to 5.0 grams of palladium per liter of hydrosol and the amount of sodium stannate and stan-plating step is very thin being on the order of from about liter of hydrosol of from about 0.35 to 35.0 grams of sodium stannate and from about 2.40 to 240 grams of stannous chloride. If desired, the one-stage activation solution described in British Pat. 942,860 consisting of an acidic aqueous solution of palladium ions as palladium chloride and an excess of stannous ions, can be employed.

ELECTROLESS METAL PLATING

Following the activation or catalyzing step it is usually desirable to treat the copper surface with an accelerating solution which can be, for example, a dilute solution of a suitable acid such as a 10 percent by volume solution of hydrochloric acid or an alkali metal hydroxide, such as a 5 percent by volume solution of sodium hydroxide. Preferably, the copper surface is immersed for about 0.1 to 5 minutes in the accelerating solution bath at room temperature. After rinsing, the copper surface is then plated in a copper electroless metal plating bath at a temperature of about 85° to 150° F. and for a period of about 5 to about 10 minutes. Any of the commercially available electroless copper baths are suitable for use in this process. Typical compositions of such baths are set forth in U.S. Pat. Nos. 2,874,072; 3,075,855; and 3,095,309. The metal deposit laid down in the electroless plating step is very thin being on the order of from about 1 to about 30 millionths of an inch in thickness. The purpose of such a metal coating is merely to provide an initial conductive surface on which copper or other metals can be electrodeposited in order to produce a metal coating of any desired thickness.

The composition of a typical electroless copper plating bath useful in the process of this invention is given below:

| | | |
|---|---|---|
| $CuSO_4 \cdot 5H_2O$ | g./l. | 8 |
| $KNaC_4H_4O_6 \cdot 4H_2O$ | g./l. | 9 |
| HCHO (37%) | mls./l. | 10 |
| pH (NaOH=12–12.7) | | |

ELECTROPLATING

The copper substrate with the electroless copper on it, after rinsing, can be electroplated in a suitable electroplating bath to build up a sufficient thickness of metal to meet any of the mechanical requirements of the plated copper substrate. For example, the copper substrate with the electroless copper coating thereon can be plated in a conventional copper electroplating bath such as a copper pyrophosphate bath at 125–139° F. for about 40 minutes at 25 amperes per square foot resulting in a copper deposit approximately one mil in thickness. Higher current densities in plating can of course give thicker deposits as desired. Other standard electroplating baths such as the following bath may be employed:

| | | |
|---|---|---|
| $CuSO_4 \cdot 5H_2O$ | g./l. | 188 |
| $H_2SO_4$ concentrated (66° Bé.) | cc./l. | 61.5 |
| Thiourea | g./l. | 0.001 |
| Wetting agent | p.p.m. | 25 |

Surprisingly, it has been found that when the copper substrate with the electroless and/or electrolytic metal coating deposited thereon is heated or baked at a temperature of about 150° to about 450° F. for about 10 mins. to about 2 hours or more at one or more points in a development of the completely plated product the bond strength between the initial copper surface and the electroless and/or electrolytic copper coating subsequently laid down thereon is tremendously improved. Preferably, the baking operation is conducted at a temperature of about 250° to about 420° F. and from 0.4 about 1 hour. The heating or baking operation can be carried out at one or more points in the process cycle, e.g., following the electroless plating step and/or after the electrolytic plating step, if employed. Usually the heating or baking step is conducted after application of the initial thin conductor metal layer in the electroless plating process and the subsequent electrolytic copper strike. While it is not necessary to heat or bake after the electroless plating step and after the electrolytic plating step, it is always required that the copper substrate be heated at least once following the electroless plating operation in order to obtain the surprisingly high adhesion results of this invention. While the mechanism by which the high adhesion values obtained is not fully understood, it is believed that baking permits the fine copper particles of the very thin electroless coating to grow, adhere and/or diffuse into the surface of the copper foil. When the process of this invention is employed in the electroless plating of copper on a copper surface, bond strengths or peel strengths of at least about 8 and as high as about 25 pounds per inch or more are consistently obtained. The heating or baking step described is, moreover, essential to produce this improved result.

MANUFACTURE OF PRINTED CIRCUIT BOARDS

In the process of this invention, circuit boards have conductor circuits on both sides and having electrical interconnections (i.e., through hole connections) between certain areas of the opposite faces can be conveniently prepared. After the holes have been punched, the copper-clad faces of the laminate are cleaned, the copper surfaces are subjected to light etching or pickling followed by catalyzation and then by electroless deposition of copper over the entire exposed surface including the non-conductive walls of the through holes in the plastic substrate as well as the copper-clad faces of the substrate. In the next step a circuit pattern is applied using an organic or polymeric masking resist. The operator is afforded a choice of several methods in the selection and application of the resist coating, all of which are known and conventional in the art. Under one method the circuit design may be outlined by a chemical resist applied by squeegeeing it through an appropriate silk screen designed to produce coverage of the non-circuit areas of the board while leaving the circuit areas themselves free of resist material. Under the alternate resist application procedure, a positive or negative photoresist composition is applied to the entire surface of the board and this is exposed to a light source through a suitable film of the desired circuit configuration, and the photoresist material is then developed by an appropriate solvent to strip away the exposed or unexposed photoresist material on the board, depending on the system used. Next the conductor areas (i.e. circuit areas) are electroplated with copper metal to the desired thickness and then covered with a metallic resist, such as a 60–40 tin-lead alloy, usually applied electrolessly or by electroplating. The organic resist is then stripped using a suitable solvent, leaving the non-circuit areas exposed and this is removed in a suitable acid or alkali etchant solution, such as an alkaline ammoniacal chloride solution of the type described in U.S. Pat. 3,466,208, chromic acid or ferric chloride. An important feature of this invention is that the circuit board is heated or baked at a temperature of about 150° to about 450° F. for about 10 min. to about 2 hours to promote effective bonding between the copper surface of the copper-clad board and the conductor metal formed in the electroless and/or electrolytic plating operations. Such heating or baking operations can be carried out at any one or more points, such as following the electroless plating step, after application of the organic resist, after the copper electroplating step, after application of the metallic resist, etc. or after completion of the circuit board. The completed circuit boards exhibit high adhesion values or peel strength between the electrolessly plated copper coating and the initial copper-clad surface of the board.

Those skilled in the art will readily recognize that water rinsing, if required, may be employed between any of the steps of the various processes set forth herein.

The following examples illustrate various embodiments of this invention and are to be considered not limitative:

Example I

A sheet of copper having a thickness of about 0.0042 inch is first cleaned by dipping it in a cleaning bath at a temperature of about 180° F. for about five minutes. The alkaline cleaner employed has the following composition:

| | G./l. |
|---|---|
| Sodium isopropyl naphthalene sulfonate | 5 |
| Sodium sulfate | 1 |
| Sodium tripolyphosphate | 10 |
| Sodium metasilicate | 5 |
| Tetrasodium pyrophosphate | 27 |

Then the copper sheet is etched by immersing it in a 25 percent solution of ammonium persulfate for 1 minute at 70° F. After a thorough water rinse, the cleaned copper sheet is immersed in a bath containing hydrochloric acid (10 percent by volume) for a period of about 3 minutes at a temperature of about 80° F. to remove any residues which may be present. In the next operation, the copper sheet is activated using the conventional two-step activation process by first immersing the copper sheet in an acid stannous chloride bath containing 15 g./l. of $SnCl_2$ and 10 ml./l of concentrated HCl following which it is contacted with an acid solution of palladium chloride containing about 1.66 grams of palladium chloride per liter and about 10 ml./l. of concentrated HCl at a temperature of about 80° for about 20 minutes. Following the activation process, the copper surface after a thorough rinsing, is immersed in a copper electroless plating bath for sufficient time to build up a copper coating of the desired thickness. The composition of the electroless plating bath is as follows:

| | | |
|---|---|---|
| $CuSO_4 \cdot 5H_2O$ | g./l. | 8 |
| $KNaC_4H_4O_6 \cdot 4H_2O$ | g./l. | 90 |
| HCHO (37%) | ml./l. | 10 |
| pH (NaOH) | | 12.6 |

Prior to the electroless plating step, the copper sheet optionally can be dipped in an accelerating solution comprising, for example, a 5 percent hydrochloric acid solution, for 1 minute at room temperature. Following the electroless plating step, the sheet, after rinsing, is baked at a temperature of about 300° F. for about 25 minutes. The copper sheet is then plated electrolytically in an acid copper bath containing about 200 g./l. of copper sulfate and 25 ml./l. of sulfuric acid for a period of about 45 minutes at 25 amperes per square foot and at a temperature of about 130° F. resulting in a copper deposit approximately 0.001 inch in thickness. The peel strength of the copper coating plated on the initial copper surface is measured and found to be in excess of 10 pounds per inch.

Example II

In the following example, which does not represent the process of this invention, the effect of omitting the heating or baking step is illustrated.

In this example a copper sheet having a thickness of about 0.002 inch was first cleaned by immersion in a mild alkaline cleaner at 170° F. for 5 minutes after which it was thoroughly rinsed in clean water. Following etching of the sheet in a cupric chloride-hydrochloric acid bath for 2 minutes at 75° F. and after rinsing, it is immersed in a solution of 10 percent by volume hydrochloric acid to remove any residues from the etching step and again rinsed. In the activation step the copper sheet is dipped into a solution of an acid tin-palladium hydrosol having the equivalent of 0.2 g. of palladium, 10 g. of sodium stannate and 12.6 g. of stannous chloride per liter of hydrosol. In this one-stage activation process, the copper sheet is immersed in the bath for 5 minutes at room temperature. In the next step, the copper sheet is immersed in an accelerating solution containing 8 percent fluoboric acid for 2 minutes at room temperature and then rinsed. Copper is then deposited electrolessly on the copper sheet by immersing it for 10 minutes at 75° F. in the following bath:

| | | |
|---|---|---|
| $CuSO_4 \cdot 5H_2O$ | g./l. | 20 |
| $NaKC_4H_4O_6 \cdot 4H_2O$ | g./l. | 40 |
| NaOH | g./l. | 10 |
| $Na_2CO_3$ | g./l. | 12 |
| Thiourea | p.p.m. | 25 |
| Formaldehyde (37%) | cc./l. | 30 |
| Tetrasodium salt of ethylenediamine tetraacetic acid | g./l. | 2 |

Following deposition of 1 mil electrolytic copper from a copper sulfate-sulfuric acid bath it was found that the Cu/Cu bond was poor and the electrolytic/electroless deposits lifted off easily from the copper cladding.

Example III

This example illustrates the preparation of a printed circuit board by the process of this invention.

A copper-clad board with through holes already punched in it is cleaned of any surface grime by dipping or immersing or spraying in a suitable alkaline soak cleaner, the alkaline cleaner is operated at a temperature of about 165° F. and the copper circuit board is immersed for a period of 20 minutes. In the second step of the process the circuit board, after being thoroughly rinsed, is contacted with the copper etching solution which in this case is a 20% solution of ammonium persulfate. The board is allowed to remain in the etchant bath for a period of about 5 minutes and at a temperature of about 75° F. with gentle agitation. In the next step the circuit board is dipped in a 10% by volume solution of hydrochloric acid at a temperature of about 80° F. for about 5 minutes following which it is thoroughly water rinsed. After being activated in a one-step activation operation by immersing the board in an acid tin-palladium hydrosol such as that disclosed in copending application of D'Ottavio Ser. No. 654,307, filed June 28, 1967, the board is given a thorough water rinse. The board is then immersed in a 5 percent solution of sodium hydroxide for 1 minute at about 80° F. and, after rinsing, is plated by immersion in an electroless metal plating bath of the following composition:

| | | |
|---|---|---|
| $CuSO_4 \cdot 5H_2O$ | g./l. | 35 |
| $KNaC_4H_4O_6 \cdot 4H_2O$ | g./l. | 170 |
| NaOH | g./l. | 50 |
| HCHO (37%) | ml./l. | 40 |

Water to make one liter.

The electroless plating operation is suitably carried out at room temperature for about 10 minutes following which the copper-clad circuit board is rinsed thoroughly. The result of the electroless metal deposition step is that a very thin continuous layer of the order of about 20 millionths of an inch is deposited over the entire surface of the circuit board as well as the wall surfaces of any through holes present. In the next step a circuit pattern is applied to the circuit board surface using an organic polymeric masking resist to define the pattern of the desired circuit. The unmasked conductor areas (i.e. circuit areas) are then electroplated with copper utilizing a plating bath of the following composition:

| | | |
|---|---|---|
| $CuSO_4 \cdot 5H_2O$ | g./l. | 195 |
| $H_2SO_4$ concentrated (66° Bé.) | cc./l. | 50 |
| Thiourea | g./l. | 0.01 |
| Wetting agent | p.p.m. | 25 |

The electroplating step is carried out at a current density of about 25 amperes per square foot using 0.8 volt and with agitation of the electroplating bath. The standard cyanide electroplating bath may also be employed. After the circuit area has been built up to a thickness of about 0.001 inch in the first electroplating operation, a tin-lead outer layer is electrolessly plated over the circuit outline by conventional methods. The board is subjected to a stripping action by treating it with a suitable organic solvent, for example, methyl ethyl ketone. In this operation the organic resist is stripped leaving the non-circuit areas of copper exposed and in the final step this non-circuit area is removed by etching in an aqueous alkaline ammoniacal chlorite solution. The finished board is then rinsed, dried and baked at 275° F. for 60 minutes.

The peel strength of the copper coating plated on the copper foil of the circuit board laminate is measured and found to be 15–20 pounds per inch.

What is claimed is:

1. A process for electroless copper deposition on a copper substrate providing improved adhesion between the electrolessly plated metal and the substrate which comprises:

(a) chemically etching the substrate with an etchant solution capable of removing superficial oxides from the surface, (b) catalyzing the substrate surface, (c) electrolessly depositing a copper coating on the catalyzed surface, and (d) heating the plated substrate at a temperature of from about 150° to about 450° F. to about 10 minutes to about 2 hours.

2. The process of claim 1 wherein step (d) the plated substrate is heated at a temperature of about 250° to about 420° F. for about 0.4 to about 1 hour.

3. The process of claim 1 wherein the copper substrate is catalyzed by contacting it with a hydrochloric acid solution of stannous chloride at about room temperature for about 10 minutes and then with a hydrochloric acid solution of palladium chloride at about room temperature for about 2 to about 20 minutes.

4. The process of claim 1 wherein the copper substrate is catalyzed by contacting it with an acid tin-palladium hydrosol for a period of about 1 to about 15 minutes at a temperature of from about 80° to about 150° F.

References Cited

UNITED STATES PATENTS

| | | | |
|---|---|---|---|
| 3,011,920 | 12/1961 | Shipley | 117—50 |
| 3,212,918 | 10/1965 | Tsu et al. | 117—47 A |
| 3,235,473 | 2/1966 | Le Duc | 117—47 A |

ALFRED L. LEAVITT, Primary Examiner

J. A. BELL, Assistant Examiner

U.S. Cl. X.R.

117—71 M, 119.6, 130 E; 156—3; 204—15, 23, 38